US008456772B2

(12) United States Patent
Ashizawa

(10) Patent No.: US 8,456,772 B2
(45) Date of Patent: Jun. 4, 2013

(54) PIEZOELECTRIC ACTUATOR, LENS BARREL, AND CAMERA

(75) Inventor: Takatoshi Ashizawa, Yokohama (JP)

(73) Assignee: Nikon Corporation, Tokyo (JP)

( * ) Notice: Subject to any disclaimer, the term of this patent is extended or adjusted under 35 U.S.C. 154(b) by 3 days.

(21) Appl. No.: 13/375,951

(22) PCT Filed: Jun. 4, 2010

(86) PCT No.: PCT/JP2010/059524
§ 371 (c)(1),
(2), (4) Date: Dec. 2, 2011

(87) PCT Pub. No.: WO2010/140681
PCT Pub. Date: Dec. 9, 2010

(65) Prior Publication Data
US 2012/0087023 A1    Apr. 12, 2012

(30) Foreign Application Priority Data

Jun. 5, 2009  (JP) .................................. 2009-136478
Jul. 29, 2009  (JP) .................................. 2009-176480

(51) Int. Cl.
*G02B 7/02* (2006.01)
*H02N 2/00* (2006.01)
(52) U.S. Cl.
USPC ......................................... 359/824; 310/317
(58) Field of Classification Search
USPC ............ 359/824; 310/317, 318, 328, 323.06
See application file for complete search history.

(56) References Cited

U.S. PATENT DOCUMENTS

| 6,977,461 | B2 * | 12/2005 | Hendriks et al. ............... 310/328 |
| 2003/0226976 | A1 | 12/2003 | Tanaka |
| 2004/0251785 | A1 * | 12/2004 | Takeuchi et al. ............... 310/328 |
| 2005/0127786 | A1 | 6/2005 | Hendriks et al. |
| 2005/0151446 | A1 | 7/2005 | Hendriks et al. |
| 2005/0253485 | A1 | 11/2005 | Kishi |
| 2009/0001852 | A1 | 1/2009 | Ashizawa |

FOREIGN PATENT DOCUMENTS

| JP | A-62-71480 | 4/1987 |
| JP | A-9-84367 | 3/1997 |
| JP | A-2003-243282 | 8/2003 |
| JP | A-2005-185094 | 7/2005 |
| JP | A-2005-328628 | 11/2005 |
| JP | A-2008-312438 | 12/2008 |

OTHER PUBLICATIONS

International Search Report issued in International Patent Application No. PCT/JP2010/059524 dated Aug. 31, 2010 (with translation).

\* cited by examiner

*Primary Examiner* — Tuyen Tra
(74) *Attorney, Agent, or Firm* — Oliff & Berridge, PLC

(57) ABSTRACT

Disclosed is a piezoelectric actuator which has an improved driving force or drive efficiency. Specifically disclosed is a piezoelectric actuator which is provided with: a plurality of piezoelectric members which have a first piezoelectric element capable of being displaced in a first direction and a second piezoelectric element capable of being displaced in a second direction intersecting the first direction, and which are divided into a plurality of groups; a relative movement member which has a contact surface that is in contact with the piezoelectric members, and which moves relatively to the piezoelectric members in the first direction; and a drive unit which, when piezoelectric members of one group among the plurality of groups are in contact with the contact surface, drives the first piezoelectric element of the piezoelectric members.

11 Claims, 14 Drawing Sheets

PIEZOELECTRIC ACTUATOR, LENS BARREL, AND CAMERA

TECHNICAL FIELD

The present invention relates to a piezoelectric actuator, a lens barrel and a camera.

BACKGROUND ART

Heretofore, a multimode ultrasonic actuator has been known (see Patent Document 1) that oscillates separately in a driving direction and a pressing direction. The principle of driving of this multimode ultrasonic actuator combines oscillations in a direction parallel to the driving direction of a moving element (torsional oscillations) and oscillations in a direction parallel to a pressing direction (longitudinal oscillations).

The multimode ultrasonic actuator pushes up the moving element with displacements caused by vertical oscillations generated in an oscillating element, at the same time generates displacements of the moving element by torsional oscillations of the oscillating element in the same direction as the driving direction of the moving element, and thus drives the moving element. The vertical oscillations also oscillate in the opposite direction to the direction of pushing up the moving element. Consequently, the oscillating element and the moving element separate when the oscillating element oscillates in the opposite direction. In this period, the oscillating element is displaced by the torsional oscillation in a direction opposite to the driving direction of the moving element. Thus, by the vertical oscillations and the torsional oscillations being combined, the moving element is driven one way in a desired direction.

A piezoelectric actuator has also been disclosed (see Patent Document 2) that combines two piezoelectric elements to drive a moving element. In Patent Document 2, a piezoelectric actuator combines a piezoelectric slip effect element with a piezoelectric lateral effect element. In this piezoelectric actuator, the piezoelectric slip effect element is displaced in the driving direction of a moving element, the piezoelectric lateral effect element is displaced in a pressing direction, and the moving element is driven by the combination thereof.

[Patent Document 1] Japanese Unexamined Patent Application, Publication No. H09-84367
[Patent Document 2] Japanese Unexamined Patent Application, Publication. No. S62-71480

DISCLOSURE OF THE INVENTION

Problems to be Solved by the Invention

However, in the multimode piezoelectric ultrasonic actuator disclosed in Patent Document 1, according to the principle of driving, there are periods in which the moving element and the oscillating element are separated. Therefore, the transmission of driving force to the moving element is fragmented in time, which impedes improvements in driving force and drive efficiency.

In the caterpillar-type piezoelectric actuator disclosed in Patent Document 2 too, there are periods in which the moving element and the oscillating element are separated. Therefore, the transmission of driving force to the moving element is fragmented in time, which impedes improvements in driving force and drive efficiency.

An object of the present invention is to provide a piezoelectric actuator, a lens barrel and a camera in which driving force and drive efficiency are improved.

Means for Solving the Problems

The present invention solves the problem described above with the solution described below. Herein, for simplicity of description, descriptions are given with reference symbols corresponding to embodiments of the present invention, but these are not limiting.

A first aspect of the present invention is a piezoelectric actuator including: a plurality of piezoelectric members each including a first piezoelectric element deformable in a first direction and a second piezoelectric element deformable in a second direction intersecting the first direction, the plurality of piezoelectric members being divided into a plurality of groups; a relative movement member that includes a contact surface in contact with the piezoelectric members and relatively moves in the first direction with respect to the piezoelectric members; and a driving unit configured to drive a first piezoelectric element of a piezoelectric member of a group such that the relative movement member relatively move in the first direction, when the piezoelectric member of the group among the plurality of groups is in contact with the contact surface, and to drive a second piezoelectric element of another piezoelectric member of another group of the plurality of groups such that another piezoelectric member of another group separates from the contact surface while driving the first piezoelectric element of the piezoelectric member of the group.

A second aspect of the present invention is a piezoelectric actuator including: a base member including an annular portion; a plurality of piezoelectric members each including a first piezoelectric element deformable in a first direction and a second piezoelectric element deformable in a second direction intersecting the first direction, the first direction being arranged tangential to a circumference of the annular portion of the base member, and the plurality of piezoelectric members being divided into a plurality of groups; a relative movement member that includes a contact surface in contact with the piezoelectric members and relatively moves in the first direction with respect to the piezoelectric members; and a driving unit configured to drive a first piezoelectric element of a piezoelectric member of a predetermined group such that the relative movement member relatively moves in the first direction, when the piezoelectric member of the predetermined group among the plurality of groups is in contact with the contact surface, and to drive a second piezoelectric element of another piezoelectric member of another group differing from the predetermined group such that another piezoelectric member of another group differing from the predetermined group separates from the contact surface while driving the first piezoelectric element of the piezoelectric member of the predetermined group.

A third aspect of the present invention is a piezoelectric actuator according to the first or second aspect in which the driving unit generates a first driving signal that controls a displacement of the first piezoelectric element in the first direction, and a second driving signal that controls a displacement of the second piezoelectric element in the second direction and includes a waveform different from the first driving signal.

A fourth aspect of the present invention is a piezoelectric actuator according to the third aspect in which the first driving signal is a triangular waveform signal and the second driving signal is a rectangular waveform signal.

A fifth aspect of the present invention is a piezoelectric actuator according to any one of the first to fourth aspects in which the plurality of groups includes at least three groups.

A sixth aspect of the present invention is a piezoelectric actuator according to any one of the first to fifth aspects further including: a base member that retains the piezoelectric members; and a third piezoelectric element provided between the base member and each piezoelectric member, the third piezoelectric element being deformable in the second direction and including a first portion and a second portion arranged along the first direction.

A seventh aspect of the present invention is a piezoelectric actuator according to the sixth aspect, in which the driving unit causes the first piezoelectric element to be displaced in the first direction such that the relative movement member moves in the first direction, and subsequently applies driving signals to the first portion and the second portion of the third piezoelectric element in waveforms differing from each other so as to counteract a vibration of the piezoelectric member that is caused by an impact force acting on the piezoelectric member, when the driving unit causes the second piezoelectric element to be displaced in the second direction such that the relative movement member separates from the piezoelectric member.

An eighth aspect of the present invention is a piezoelectric actuator according to the sixth aspect further including a detector that detects a voltage produced between the first portion and the second portion and is provided between the base member and the third piezoelectric element. The driving unit causes the first piezoelectric element to be displaced in the first direction such that the relative movement member moves in the first direction, and subsequently applies respective voltage signals to the first portion and the second portion of the third piezoelectric element so as to counteract a voltage detected by the detector, when the driving unit causes the second piezoelectric element to be displaced in the second direction such that the relative movement member separates from the piezoelectric member.

A ninth aspect of the present invention is a piezoelectric actuator according to any one of the first to eighth aspects in which the first piezoelectric element is disposed more adjacent to the relative movement member than the second piezoelectric element.

A tenth aspect of the present invention is a lens barrel equipped with the piezoelectric actuator according to any one of the first to ninth aspects.

An eleventh aspect of the present invention is a camera equipped with the piezoelectric actuator according to any one of the first to ninth aspects.

The configurations described above with reference symbols assigned may be suitably modified and at least portions thereof may be replaced with other constituents. Effects of the Invention According to the present invention, the piezoelectric actuator, the lens barrel and the camera in which driving force and drive efficiency are improved may be provided.

EXPLANATION OF REFERENCE NUMERALS

1, 10, 200: piezoelectric actuator; 11, 211: base member; 212: moving member; 12A: driven surface; 20 (20A, 20B, 20C), 120 (120A, 120B, 120C), 220 (220A, 220B, 220C): piezoelectric member; 21, 121: driving piezoelectric element portion; 22, 122: clutch piezoelectric element device 30, 130: control section; 122Ca: first input electrode; 122Cb: second input electrode; 124: detection piezoelectric element portion; 124A: piezoelectric element; 124B: detection electrode

PREFERRED MODE FOR CARRYING OUT THE INVENTION

First Embodiment

Herebelow, a first embodiment of the present invention is described with reference to the attached drawings and suchlike.

Figure 1:
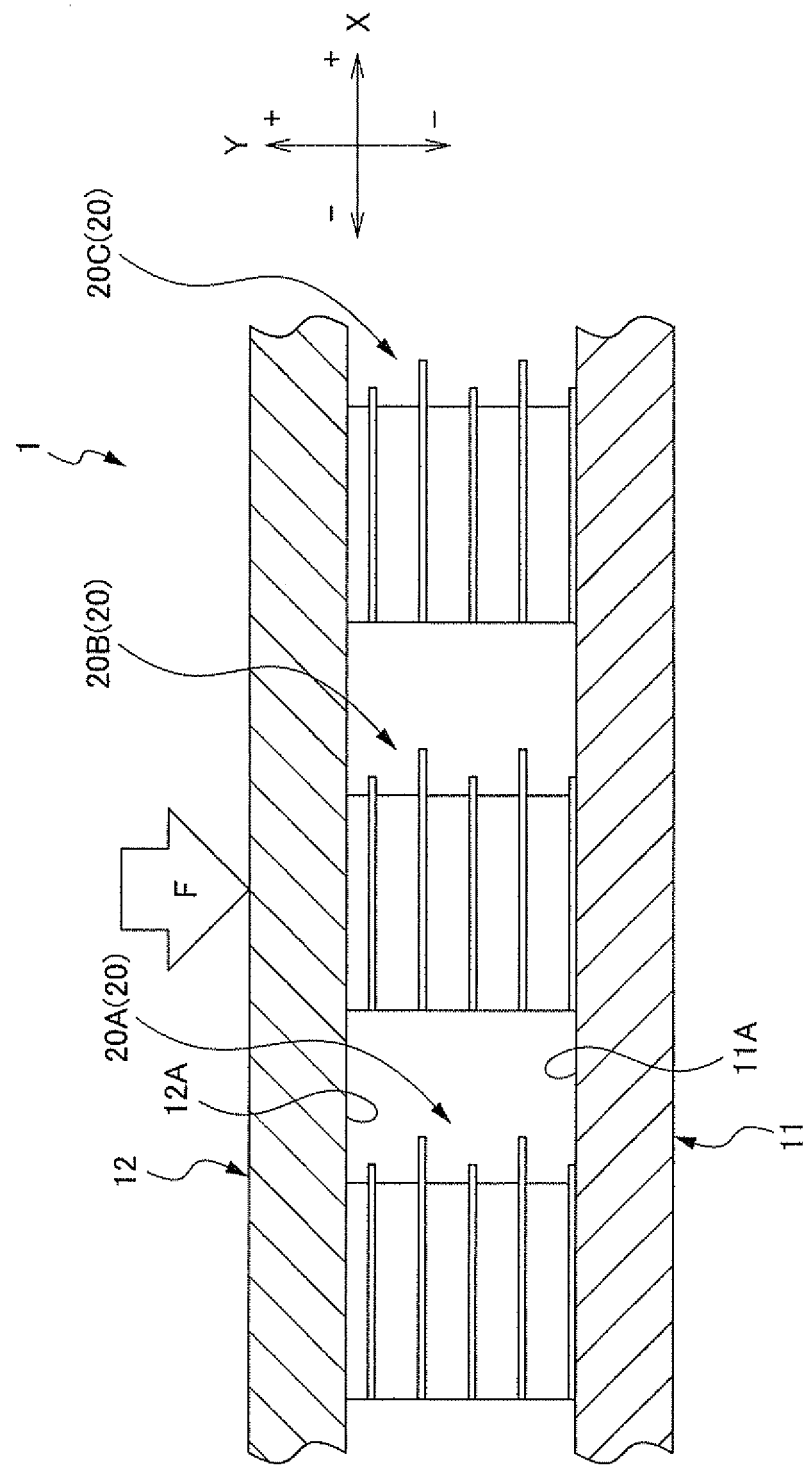
FIG. 1 is a diagram schematically illustrating constituent of a piezoelectric actuator of a first embodiment of the present invention.
Figure 2:
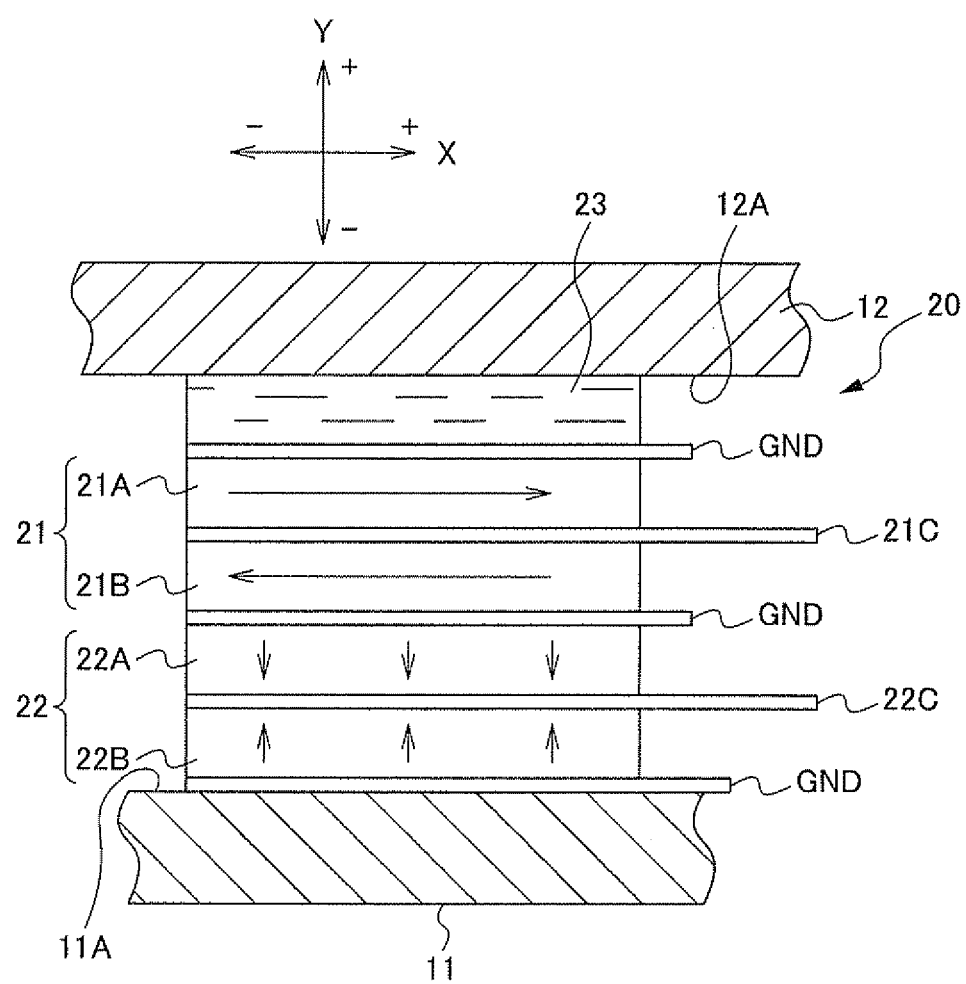
FIG. 2 is a magnified diagram of a piezoelectric member of the piezoelectric actuator of the first embodiment.

FIG. 1 is a diagram schematically illustrating constituent of a piezoelectric actuator 1, which is the first embodiment of the present invention. FIG. 2 is a magnified diagram of a piezoelectric member 20 of the piezoelectric actuator 1. In the descriptions below, directions are indicated by X-Y coordinates as illustrated in the drawings. That is, the left-right direction in the drawings is the X direction, with the right side being the +X side and the left side being the −X side, and the up-down direction orthogonal to the X direction in the drawings is the Y direction, with the upper side being the +Y side and the lower side being the −Y side.

The piezoelectric actuator 1 illustrated in FIG. 1 is provided with a base member 11, a moving member 12 that is movable relative to the base member 11, and the piezoelectric members 20 that drive movement of the moving member 12.

The base member 11 and the moving member 12 each have a shape of a plate with a predetermined thickness and extend in the X direction. The piezoelectric members 20 are disposed between the base member 11 and the moving member 12. The moving member 12 is pressed and urged toward the base member 11 (in the −Y direction) with a predetermined force F by unillustrated urging means. As a result, the base member 11 and the moving member 12 are arranged in parallel with each other with a spacing regulated by the piezoelectric members 20.

Each piezoelectric member 20 is disposed upright on an upper face of the base member 11 opposite to the moving member 12 (an opposing face 11A).

Each piezoelectric member 20 is constituted by a set of three piezoelectric members 20A, 20B and 20C. The three piezoelectric members 20A, 20B and 20C have identical constituents apart from control being different as described below. In the following descriptions, except where it is necessary to be specific, each of the three piezoelectric members 20A, 20B and 20C is referred to as the piezoelectric member 20. FIG. 1 shows the three piezoelectric members 20A, 20B and 20C as all being in the same operational state. In practice, however, they will be in respectively different operational states. Operation of the piezoelectric members will be described later.

As mentioned above, the moving member 12 is disposed in parallel with the base member 11 at the upper side of the base member 11 (the −FY direction side), with the spacing regulated by the piezoelectric members 20. A face of the moving member 12 that opposes the base member 11 (the lower face) is flat and serves as a driven surface 12A.

Three piezoelectric members 20 (20A, 20B and 20C) are disposed on the opposing face 11A of the base member 11 with a predetermined spacing in the X direction.

The piezoelectric members 20A, 20B and 20C receive respective driving signals and carry out operations to drive movement of the moving member 12 with different timings. Respective upper faces of the piezoelectric members 20A, 20B and 20C (upper faces of friction members 23 which are described below) are machined by grinding or lapping and are formed so as to be at the same position in the Y direction (coplanar) when they are in the same operations.

Next, constituent and operation of the piezoelectric member 20 is described in more detail.

As illustrated in FIG. 2, the piezoelectric member 20 is constituted by four piezoelectric elements 21A, 21B, 22A and 22B being laminated and made integral, and the friction members 23 being bonded to the topmost face thereof.

The four laminated piezoelectric elements 21A, 21B, 22A and 22B are in square shapes or rectangular shapes, and silver electrodes are applied to both front and rear faces thereof. The piezoelectric elements 21A, 21B, 22A and 22B are joined to electrode plates alternately and are joined such that polarization directions thereof alternate. Although the piezoelectric elements 21A, 21B, 22A and 22B have square shapes or rectangular shapes in the present embodiment, other shapes such as, for example, circles and the like are possible provided directions of deformation can be specified.

Two pairs, upper and lower, of the piezoelectric elements 21A, 21B, 22A and 22B have different functions. The two piezoelectric elements 21A and 21B at the upper side in FIG. 2 constitute a driving piezoelectric element portion 21, and the two piezoelectric elements 22A and 22B at the lower side constitute a clutch piezoelectric element portion 22.

The piezoelectric elements 21A and 21B constituting the driving piezoelectric element portion 21 have been subjected to polarization processing in the direction in which the moving member 12 is to be moved (the X direction). The two piezoelectric elements 21A and 21B are laminated such that the polarization directions thereof are opposite, sandwiching an A-phase input electrode 21C. Thus, if a direct current voltage is applied to the two piezoelectric elements 21A and 21B in the thickness direction thereof, then as shown by arrows in FIG. 2, the driving piezoelectric element portion 21 displaces (by the $d_{15}$ piezoelectric effect) in a shearing direction (the direction in which the two piezoelectric elements 21A and 21B are offset to left and right in the drawing).

Figure 4:
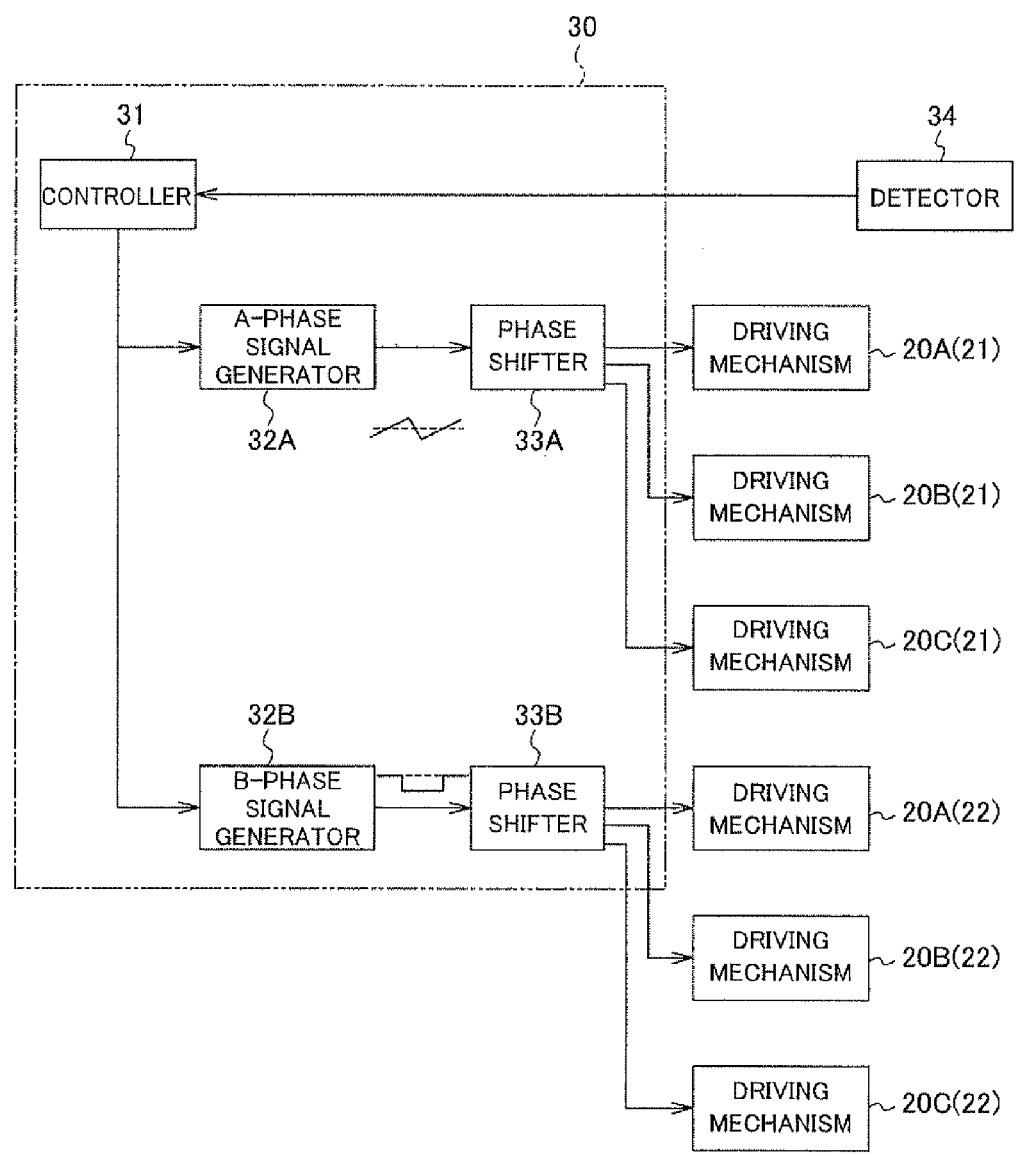
FIG. 4 is a block diagram of a driving control device that controls driving of the piezoelectric actuator.

As illustrated in FIG. 4, which is described below, an A-phase driving signal (voltage) is applied to the driving piezoelectric element portion 21 (the piezoelectric elements 21A and 21B) from an A-phase signal generator 32A of a driving control device 30.

The piezoelectric elements 22A and 22B constituting the clutch piezoelectric element portion 22 have been subjected to polarization processing in the thickness direction (the Y direction). The two piezoelectric elements 22A and 22B are laminated such that the polarization directions thereof are opposite, sandwiching a B-phase input electrode 22C. Thus, if a direct current voltage is applied to the two piezoelectric elements 22A and 22B in the thickness direction thereof, then as shown by the arrows in FIG. 2, the clutch piezoelectric element portion 22 displaces (by the $d_{33}$ piezoelectric effect) in a compression direction (the lamination direction of the two piezoelectric elements 22A and 22B).

As illustrated in the FIG. 4 described below, a B-phase driving signal (voltage) is applied to the piezoelectric elements 22A and 22B of the clutch piezoelectric element portion 22 from a B-phase signal generator 32B of the driving control device 30.

The present embodiment is constituted such that a direct current voltage opposite to the polarization directions is applied to the clutch piezoelectric element portion 22 (the piezoelectric elements 22A and 22B), and is configured such that the clutch piezoelectric element portion 22 contracts in the thickness direction in response to the application of the voltage.

The friction members 23 are provided in order to drive the moving member 12 efficiently. It is preferable if the friction members 23 have a friction coefficient with respect to the moving member 12 (the driven surface 12A) of at least 0.5. For example, if the moving member 12 is formed of an aluminum material whose surface is anodized, a polycarbonate into which glass fibers are mixed is suitable for the friction members 23. However, this is not a limitation and other combinations may be applicable provided the friction coefficient is large.

As mentioned above, the piezoelectric member 20 that is constituted by the driving piezoelectric element portion 21 (the piezoelectric elements 21A and 21B) and the clutch piezoelectric element portion 22 (the piezoelectric elements 22A and 22B) being laminated produces displacements in respectively intersecting directions in accordance with on/off control of driving signal voltages. The displacement direction of the driving piezoelectric element portion 21 is the direction of driving of movement of the moving member 12 (the X direction). Hereinafter, displacements in the X direction are referred to as driving displacements. The displacement direction of the clutch piezoelectric element portion 22 is a height direction (the Y direction), which is orthogonal to the displacement direction of the driving piezoelectric element portion 21. Hereinafter, displacements in the Y direction are referred to as clutch displacements.

It is noted that the clutch piezoelectric element portion 22 of the present embodiment is configured to contract in the thickness direction when a voltage is applied as described above. According to this constituent, processing of the aforementioned upper face of the friction member 23 to produce accuracy may be carried out with the B-phase driving signal turned off (with no voltage being applied). Thus, ease of working during this processing is improved. However, this is not a limitation; a structure that expands in the thickness direction when the B-phase driving signal is turned on may alternatively be possible.

The piezoelectric member 20 configured as described above drives the moving member 12 to move in the X direction by repeating driving displacements and clutch displacements.

FIG. 3 is a diagram giving a step-by-step description of driving of movement of the moving member 12 by each piezoelectric member 20. The state shown in FIG. 3A is an initial state. In the initial state, no voltage is applied to the clutch piezoelectric element portion 22, and the upper face of the friction member 23 is in pressure contact with the lower face (the driven surface 12A) of the moving member 12.

Figure 3A:
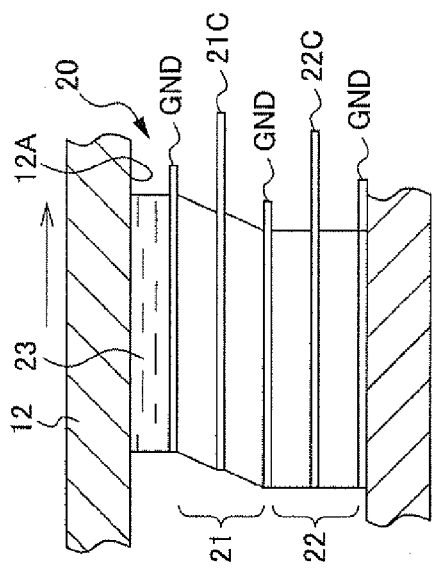
FIGS. 3A to 3D are diagrams giving a step-by-step description of driving of movement of a moving member by the piezoelectric member of the first embodiment.
Figure 3B:
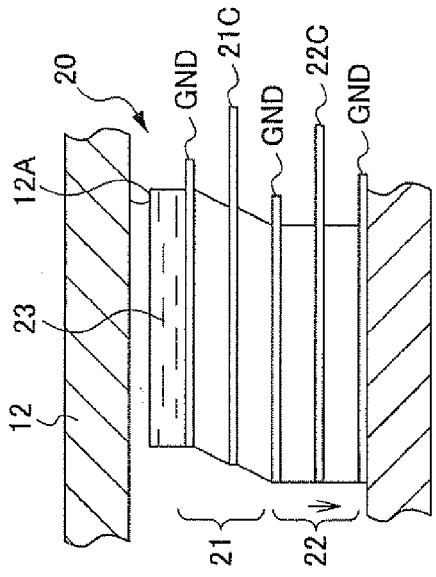

Next, as illustrated in FIG. 3B, the driving piezoelectric element portion 21 is driven and displaced, and the moving member 12 is driven to move.

Figure 3C:
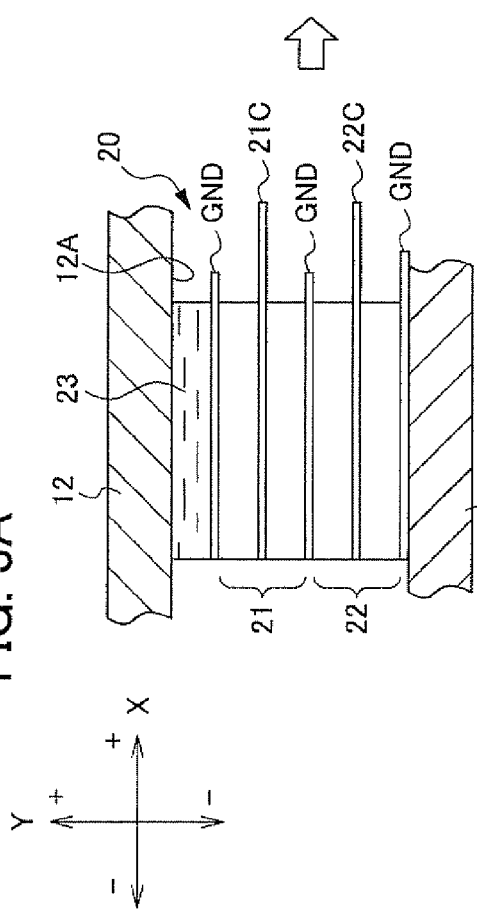

After the moving member 12 has been driven to move, as illustrated in FIG. 3(c), a voltage is applied to the clutch piezoelectric element portion 22, the clutch piezoelectric element portion 22 is compressed and displaced in the clutch direction, and the pressure contact of the friction member 23 with the moving member 12 is released.

Figure 3D:
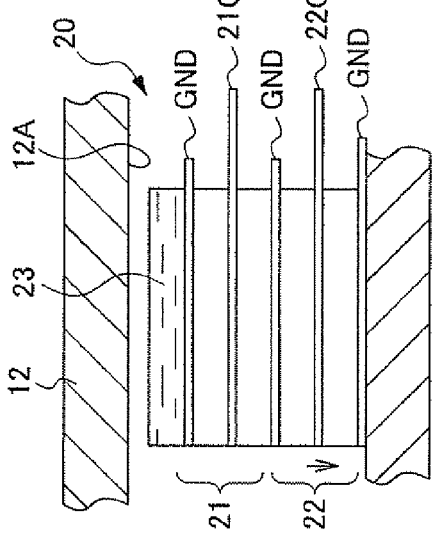

In this state, as illustrated in FIG. 3D, the driving piezoelectric element portion 21 is returned to a state of not being displaced.

By these steps being repeated, the moving member 12 may be driven to move in the +X direction. In the states illustrated in FIG. 3C and FIG. 3D, in which the pressure contact of the friction member 23 with the moving member 12 is released, other piezoelectric members, which are not shown in the figures, are in pressure contact with the moving member 12 and regulate the position of the moving member 12.

FIG. 4 is a block diagram of the driving control device 30 that controls driving of the piezoelectric actuator 1. Driving of the aforementioned piezoelectric members 20A, 20B and 20C is controlled by the driving control device 30 as illustrated in FIG. 4. The driving control device 30 includes a controller 31, the signal generators 32A and 32B, and phase shifters 33A and 33B.

The controller 31 sends instructions to the signal generators 32A and 32B on the basis of, for example, results of position detection for a driven body performed by a sensor (a detector 34) provided at the driven body.

The A-phase signal generator 32A generates the A-phase driving signal to be applied to the driving piezoelectric element portion 21.

The A-phase driving signal has an asymmetric saw-tooth waveform. Speed is controlled by a peak voltage value of the A-phase driving signal being altered.

The B-phase signal generator 32B generates the B-phase driving signal to be applied to the clutch piezoelectric element portion 22.

The B-phase driving signal has a negative rectangular waveform. The B-phase driving signal does not participate in speed control and its peak voltage value is constant.

The A-phase phase shifter 33A and the B-phase phase shifter 33B distribute the driving signals generated by the A-phase signal generator 32A and the B-phase signal generator 32B (the A-phase driving signal and the B-phase driving signal) to each of the piezoelectric members 20A, 20B and 20C.

That is, the A-phase phase shifter 33A inputs the A-phase driving signal generated by the A-phase signal generator 32A to each of the piezoelectric members 20A, 20B and 20C with offset phases.

The B-phase phase shifter 33B inputs the B-phase driving signal generated by the B-phase signal generator 32B to each of the piezoelectric members 20A, 20B and 20C with offset phases.

The detector 34 detects results of driving (states) of the piezoelectric actuator 1 and sends feedback to the controller 31 as control information. The controller 31 controls the signal generators 32A and 32B and the phase shifters 33A and 33B, and implements driving of movement of the moving member 12 with the above-described piezoelectric members 20A, 20B and 20C with offset timings. Thus, the moving member 12 is driven to move continuously without interruptions.

Figure 5:
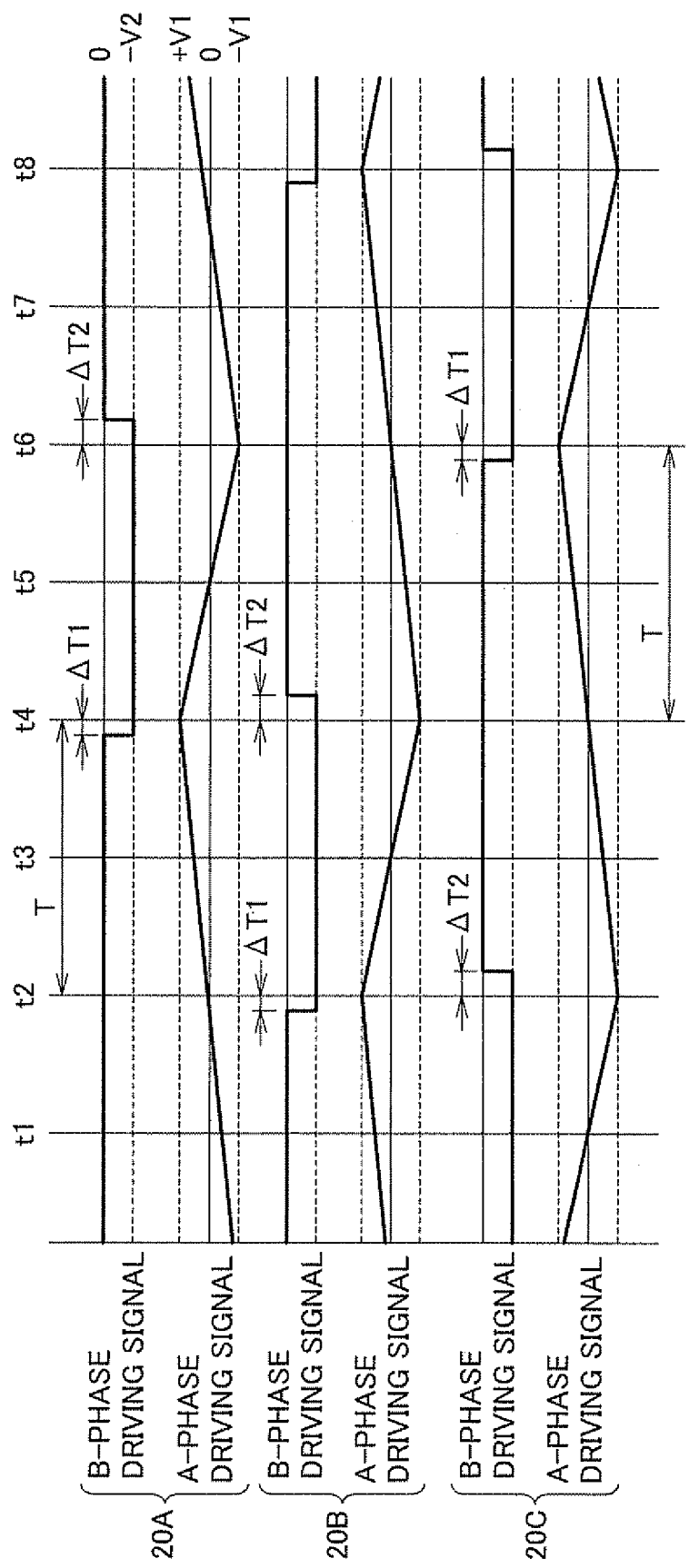
FIG. 5 is a time chart of driving signals that are inputted to respective piezoelectric members.
Figure 6:
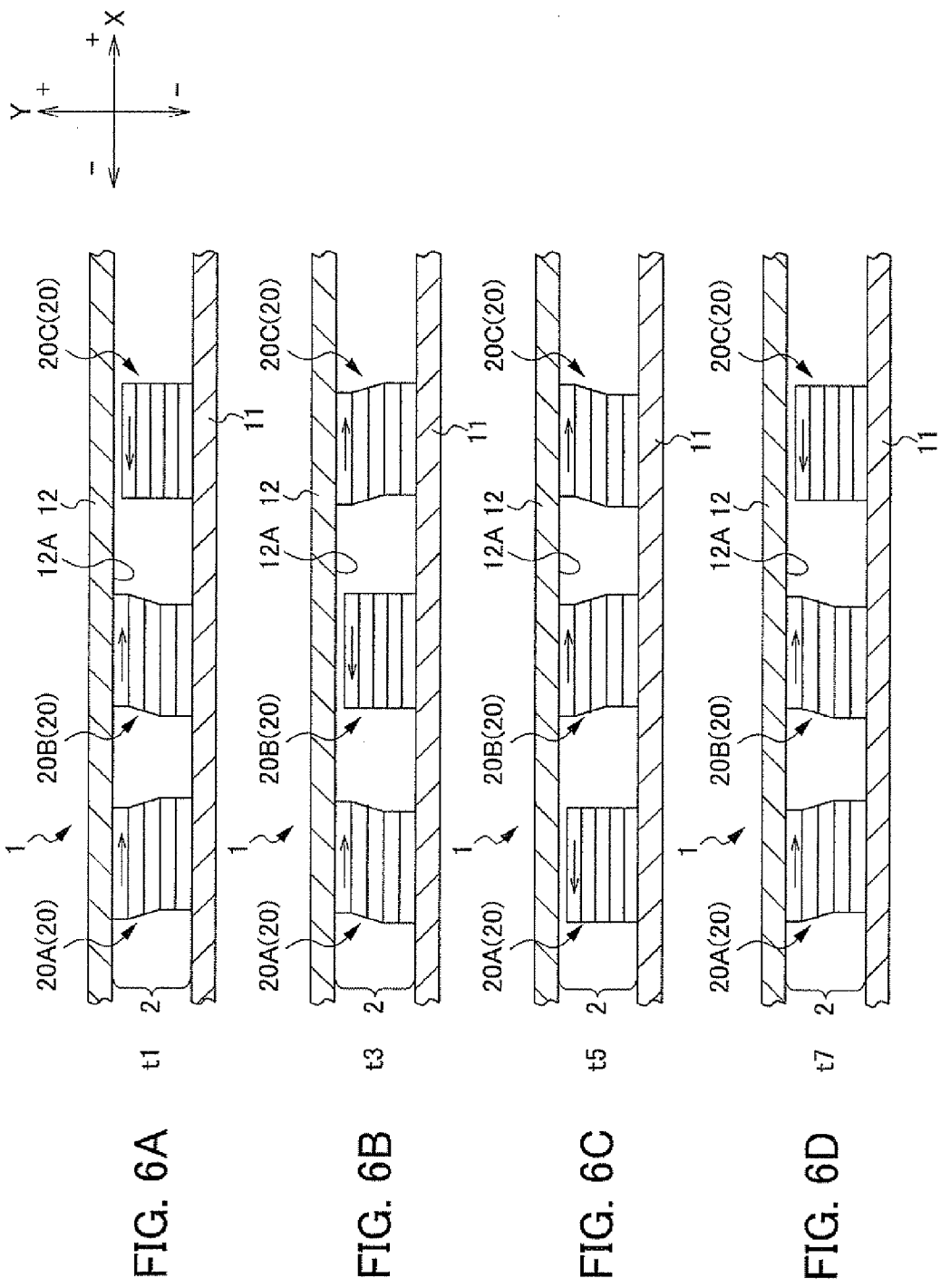
FIGS. 6A to 6D are diagrams schematically illustrating states of the piezoelectric actuator at particular times in FIG. 5.

Next, overall operation of the piezoelectric members 20A, 20B and 20C and the piezoelectric actuator 1 controlled by the driving control device 30 is described with reference to FIGS. 5 and 6 in addition to the aforementioned FIGS. 3 and 4. FIG. 5 is a time chart of A-phase driving signals and B-phase driving signals that are inputted to the piezoelectric members 20A, 20B and 20C. FIG. 6 is a diagram schematically illustrating states of the piezoelectric actuator 1 (the piezoelectric members 20) at particular times (tx) in FIG. 5.

First, basic patterns of the A-phase and B-phase driving signals that drive the piezoelectric member 20 are described.

As mentioned above, the A-phase driving signal that drives the driving piezoelectric element portion 21 has an asymmetric saw-tooth waveform. The A-phase driving signal changes linearly across 0 V from a negative voltage (−V1) to a positive voltage (+V1) and from the positive to the negative. The driving piezoelectric element portion 21 is driven and displaced a little in the +X direction in accordance with a change of the A-phase driving signal from negative to positive, and is returned in the −X direction in accordance with a change from positive to negative.

In this case, a ratio of the duration of a half-cycle of the A-phase driving signal from the positive side peak to the negative side peak to the duration of a half-cycle from the negative side peak to the positive side peak is set to 0.5. That is, the driving piezoelectric element portion 21 returns from the driven displacement to the initial state in a duration half the duration from the initial state to the driven displacement.

The B-phase driving signal that drives the clutch piezoelectric element portion 22 is a negative rectangular waveform. The B-phase driving signal changes from 0 V to a predetermined negative voltage (−V2), and from the negative voltage (−V2) to 0 V. The clutch piezoelectric element portion 22 is driven and displaced (contracted) according to the change (voltage-on) to the negative voltage (−V2) from 0 V, the initial state in which the B-phase driving signal is at 0 V.

The on/off timings of the A-phase driving signal and the B-phase driving signal are specified such that the B-phase driving signal turns on just before ($\Delta T1$ before) the positive side peak of the A-phase driving signal, and the B-phase driving signal turns off just after ($\Delta T2$ after) the negative side peak of the A-phase driving signal. That is, the B-phase driving signal is turned on and the clutch piezoelectric element portion 22 is in the contracted state during an aggregate period of time: a period of time during which the driving piezoelectric element portion 21 is returning from the maximum displacement in the +X direction to the maximum displacement in the −X direction plus the predetermined durations ($\Delta T1$ and $\Delta T2$) before and after this period.

According to the specifications as described above, as has been described using FIGS. 3A to 3D, in the state in which the voltage applied to the clutch piezoelectric element portion 22 is zero, the upper face of the friction member 23 is in pressure contact with the lower face (the driven surface 12A) of the moving member 12, and the moving member 12 is driven to move in the −X direction by driving displacement produced by the driving piezoelectric element portion 21. Then, a sequence of operations is carried out in which the voltage −V2 is applied to the clutch piezoelectric element portion 22, the clutch piezoelectric element portion 22 is displaced in a contracting direction, the pressure contact of the friction member 23 with the moving member 12 is released, and the driving piezoelectric element portion 21 is driven and displaced in the −X direction.

The A-phase driving signal and the B-phase driving signal with the basic patterns described above are inputted to the piezoelectric members 20A, 20B and 20C with phases offset by a period T. The period T is specified to equal the duration of the half-cycle of the A-phase driving signal from the positive side peak to the negative side peak.

Next, operations of the driving piezoelectric element portion 21 and the clutch piezoelectric element portion 22 at each of the piezoelectric members 20A, 20B and 20C and movements of the moving member 12 are described step-by-step in a time series.

Time t1:

At the piezoelectric member 20A, the A-phase driving signal is at a negative value and changing in a rising direction, and the B-phase driving signal is at 0 V.

At the piezoelectric member 20B, the A-phase driving signal is at a positive value and changing further in the rising direction, and the B-phase driving signal is at 0 V.

At the piezoelectric member 20C, the A-phase driving signal is changing from a positive value to a negative value, and the B-phase driving signal is at −V2.

In other words, at time t1, as illustrated in FIG. 6A, the piezoelectric member 20A and the piezoelectric member 20B are not contracted in a clutch displacement direction but in pressure contact with the moving member 12, so that they drive and displace the moving member 12 in the +X direction.

The piezoelectric member 20C is contracted in the clutch displacement direction and separated from the moving member 12, and is driven and displaced in the −X direction. Because the piezoelectric member 20C is separated from the moving member 12 at this time, the moving member 12 is not driven and displaced by the piezoelectric member 20C.

Time t3:

At the piezoelectric member 20A, the A-phase driving signal is at a positive value and changing further in the rising direction, and the B-phase driving signal is at 0 V.

At the piezoelectric member 20B, the A-phase driving signal is changing from a positive value to a negative value, and the B-phase driving signal is at −V2.

At the piezoelectric member 20C, the A-phase driving signal is at a negative value and changing in the rising direction, and the B-phase driving signal is at 0 V.

In other words, at time t3, as illustrated in FIG. 63, the piezoelectric member 20A and the piezoelectric member 20C are not contracted in the clutch displacement direction but in pressure contact with the moving member 12, so that they drive and displace the moving member 12 in the +X direction. The piezoelectric member 20B is contracted in the clutch displacement direction and separated from the moving member 12, and is driven and displaced in the −X direction. Because the piezoelectric member 203 is separated from the moving member 12 at this time, the moving member 12 is not driven and displaced by the piezoelectric member 20B.

Time t5:

At the piezoelectric member 20A, the A-phase driving signal is changing from a positive value to a negative value, and the B-phase driving signal is at −V2.

At the piezoelectric member 20B, the A-phase driving signal is at a negative value and changing in the rising direction, and the B-phase driving signal is at 0 V.

At the piezoelectric member 20C, the A-phase driving signal is at a positive value and changing further in the rising direction, and the B-phase driving signal is at 0 V.

At time t5, as illustrated in FIG. 6C, the piezoelectric member 20A is contracted in the clutch displacement direction and separated from the moving member 12, and is driven and displaced in the −X direction. Because the piezoelectric member 20A is separated from the moving member 12 at this time, the moving member 12 is not subject to displacement driven by the piezoelectric member 20B.

The piezoelectric member 20B and the piezoelectric member 20C are not contracted in the clutch displacement direction but in contact with the moving member 12, so that they drive and displace the moving member 12 in the +X direction.

Time t7:

The same as at time t1 as described above.

By the steps described above being repeated, the piezoelectric members 20A, 20B and 20C successively come into pressure contact with the moving member 12 and drive the moving member 12 to move in the +X direction. Thus, the moving member 12 may be continuously driven to move in the +X direction.

While the control configuration described above drives the moving member 12 to move in the +X direction, the moving member 12 may be driven to move in the −X direction by the A-phase driving signal being inverted positive-to-negative.

The present embodiment described above has the following advantageous effects.

(1) Because the three piezoelectric members 20A, 20B and 20C are provided and successively come into pressure contact with the moving member 12, and periods of pressure contact thereof overlap, the height of the moving member 12 does not change. Therefore, it is possible to: suppress vibrations of the moving member 12; perform smooth transmission; improve transmitted driving force and drive efficiency; and perform driving at higher rotation speeds.

(2) The clutch piezoelectric element portions 22 perform the pressure contact with the moving member 12, and the driving piezoelectric element portions 21 perform the movement operations of the moving member 12. That is, since the pressure contact with and the driving of movement of the moving member 12 are completely separate from each other, it is possible to perform independent driving control. Therefore, since a degree of freedom of control is higher, it is possible to realize high driving accuracy.

(3) Furthermore, because the pressure contact with and the driving of movement of the moving member 12 are completely separate from each other and independent driving control is possible, unnecessary relative displacements (rubbing) do not occur between the piezoelectric members 20 and the moving member 12. Consequently, it may be possible to suppress abrasion due to rubbing.

Second Embodiment

Next, a second embodiment of the present invention is described with reference to FIG. 7 to FIG. 10.

Figure 7:
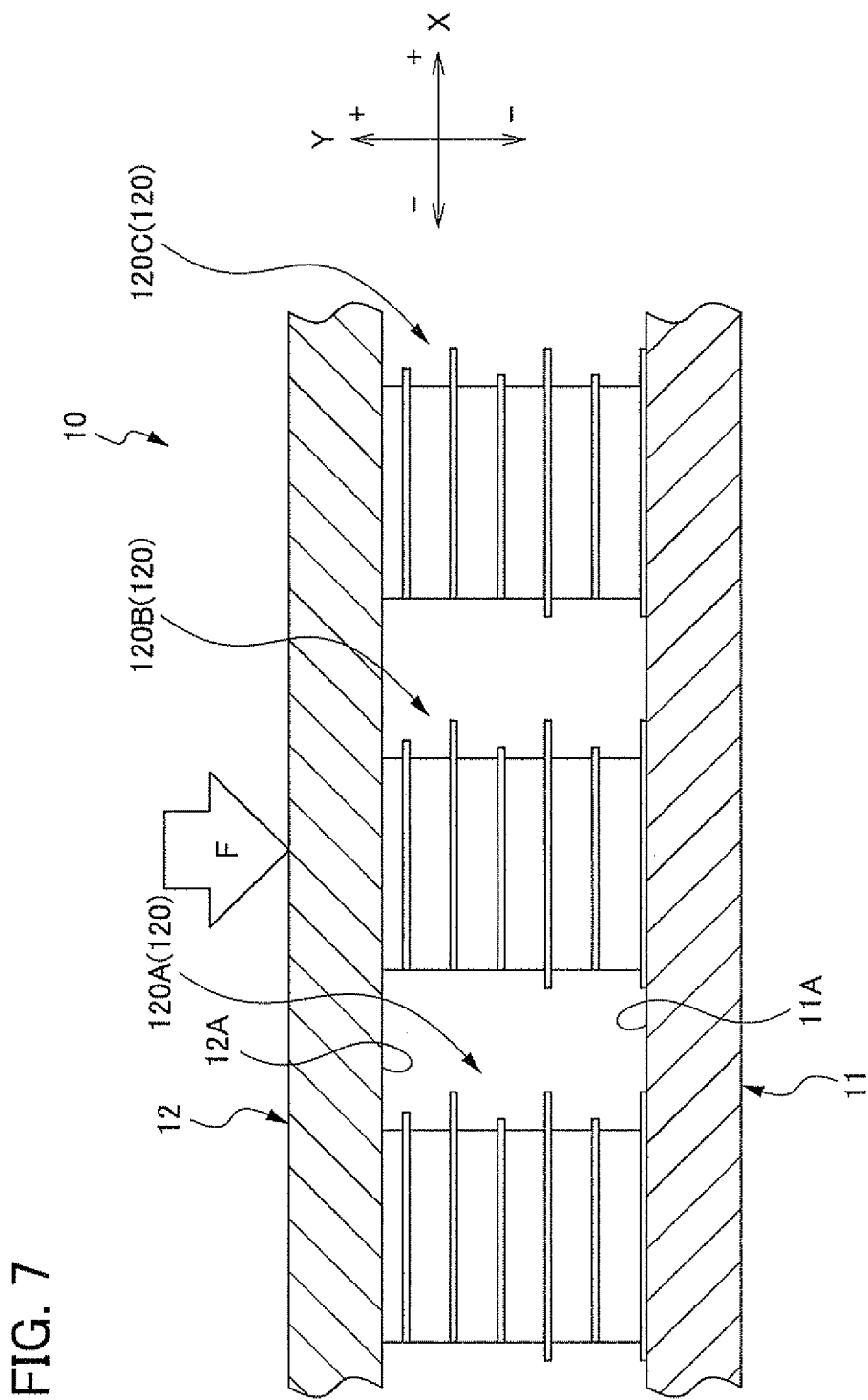
FIG. 7 is a diagram schematically illustrating constituent of a piezoelectric actuator of a second embodiment of the present invention.
Figure 8:
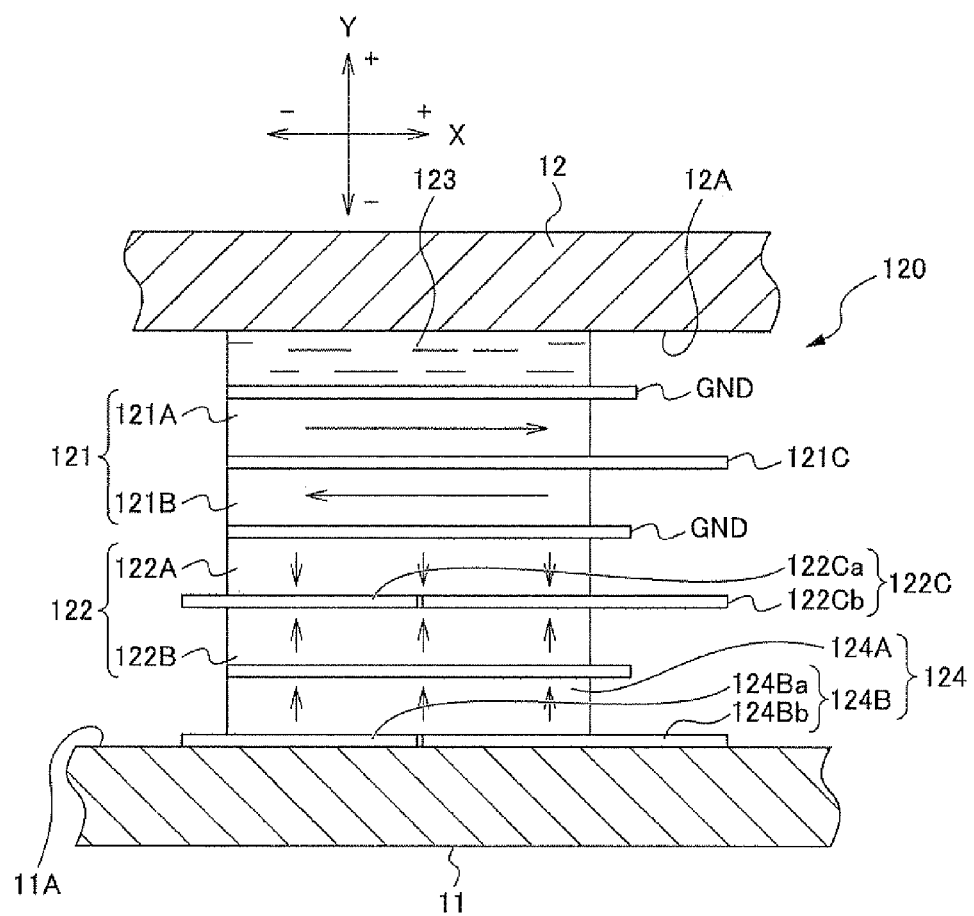
FIG. 8 is a magnified diagram of a piezoelectric member of the piezoelectric actuator of the second embodiment.
Figure 9:
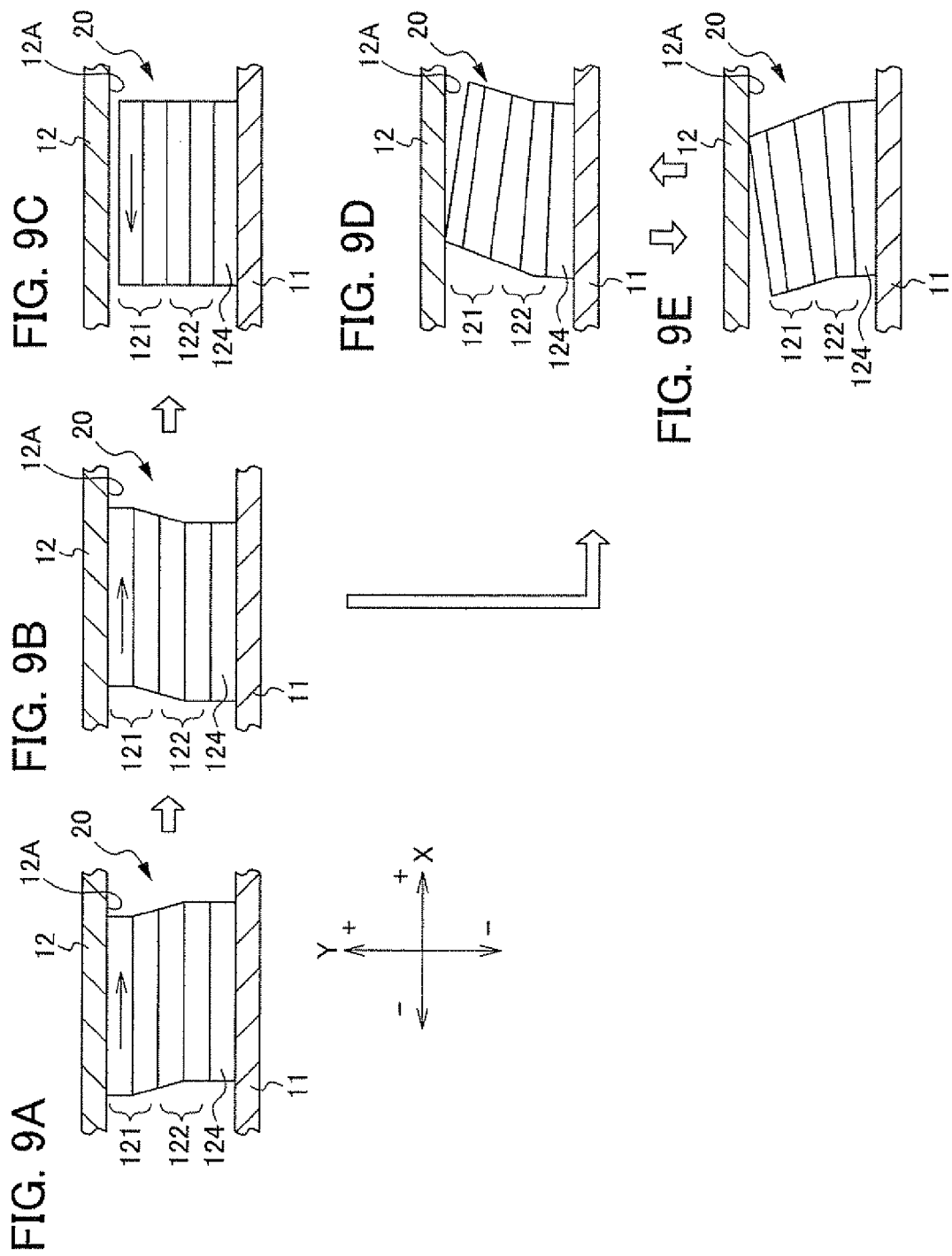
FIGS. 9A to 9E are diagrams describing a mechanism by which a vibration is caused.
Figure 10:
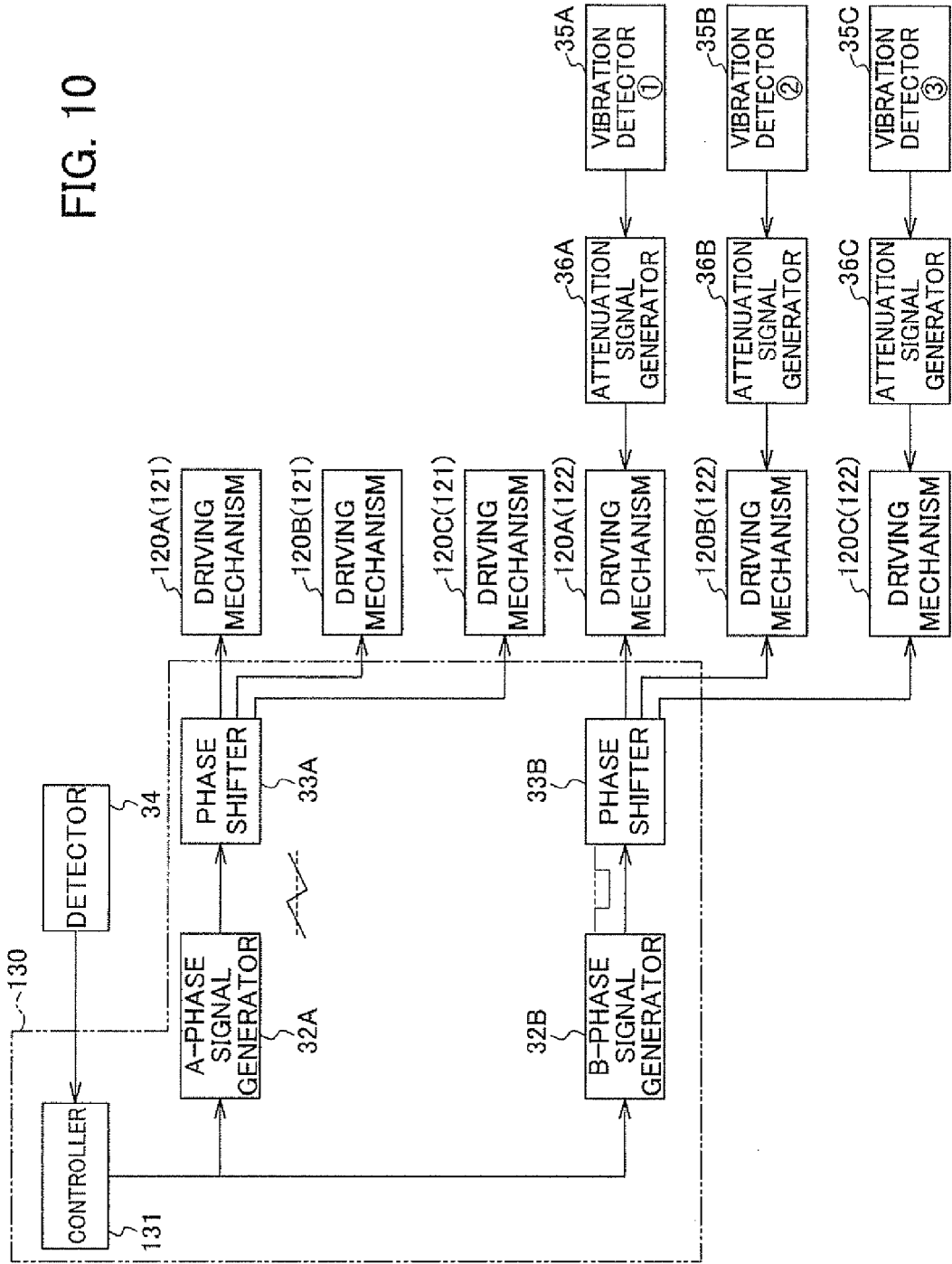
FIG. 10 is a block diagram of a driving control device that controls driving of the piezoelectric actuator of the second embodiment.

FIG. 7 is a diagram schematically illustrating constituent of a piezoelectric actuator 10 of the second embodiment of the present invention. FIG. 8 is a magnified diagram of a piezoelectric member 120 of the piezoelectric actuator 10. FIG. 9 is a diagram describing a mechanism by which a vibration is caused. FIG. 10 is a block diagram of a driving control device 130 that controls driving of the piezoelectric actuator 10.

In the drawings, structural elements that have the same functions as in the first embodiment described above are assigned the same symbols, and descriptions thereof are not given.

The piezoelectric actuator 10 differs from the piezoelectric actuator 1 of the above-described first embodiment (see FIG. 1) in constituents of the piezoelectric members 120 (120A, 120B and 120C).

As illustrated in FIG. 8, the piezoelectric member 120 is laminated of a driving piezoelectric element portion 121, clutch piezoelectric element portion 122, friction member 123, and detection piezoelectric element portion 124. The driving piezoelectric element portion 121 is composed of two piezoelectric elements 121A and 121B. The clutch piezoelectric element portion 122 is composed of two piezoelectric elements 122A and 122B. The friction member 123 is bonded to the uppermost face of the piezoelectric member 120.

Constituents of the driving piezoelectric element portion 121 and the friction member 123 are the same as those of the driving piezoelectric element portion 21 and the friction member 23 of the first embodiment described above (see FIG. 2). That is, in the driving piezoelectric element portion 121, the piezoelectric elements 121A and 121B are laminated such that polarity directions thereof are opposite, sandwiching an A-phase input electrode 121C therebetween. Other details thereof are not described.

The basic constituent of the clutch piezoelectric element portion 122 is the same as that of the clutch piezoelectric element portion 22 of the first embodiment described above (see FIG. 2), but the constituent of a B-phase input electrode 122C is different. That is, the B-phase input electrode 122C disposed between the piezoelectric elements 122A and 122B is partitioned into a first input electrode 122C$a$ and a second input electrode 122C$b$ electrically insulated from each other at substantially the middle of the B-phase input electrode 122C in a direction of driving movement of the moving member 12 (an X direction). Driving signals may be separately applied to the first input electrode 122C$a$ and the second input electrode 122C$b$.

The detection piezoelectric element portion 124 is disposed between the clutch piezoelectric element portion 122 and a base member 11. A ground electrode is disposed between the detection piezoelectric element portion 124 and the clutch piezoelectric element portion 122, and a detection electrode 124B is disposed between the detection piezoelectric element portion 124 and the base member 11.

Similarly to the piezoelectric elements 122A and 122B that constitute the clutch piezoelectric element portion 122, the detection piezoelectric element portion 124 is constituted by a piezoelectric element 124A that has been subjected to polarization processing in a thickness direction (a Y direction). The detection piezoelectric element portion 124 (the piezoelectric element 124A) produces a positive voltage in response to an extension displacement in the Y direction, and produces a negative voltage in response to a contraction displacement (the $d_{33}$ piezoelectric effect).

The detection electrode 124B is partitioned into a first detection electrode 124B$a$ and a second detection electrode 124B$b$ electrically insulated from each other at substantially the middle of the detection electrode 124B in the direction of driving movement of the moving member 12 of the piezoelectric actuator 10 (the X direction). In this manner, detection signals may be separately acquired from the first detection electrode 124B$a$ and the second detection electrode 124B$b$.

The piezoelectric member 120 configured as described above detects tilting in the direction of driving movement of the moving member 12 of the piezoelectric member 120 (the X direction) based on detection outputs from the detection electrode 124B (the first detection electrode 124B$a$ and the second detection electrode 124B$b$). In addition, because driving signals may be separately inputted into the B-phase input electrode 122C (the first input electrode 122C$a$ and the second input electrode 122C$b$) of the clutch piezoelectric element portion 122, the clutch piezoelectric element portion 122 may be driven so as to tilt in the X direction (tilt driving).

In this manner, the piezoelectric member 120 may be controlled so as to suppress a swaying vibration of the piezoelectric actuator 10 that is caused by a reaction force resulting from the driving force acting on the moving member 12.

That is, as illustrated in FIG. 9, when the piezoelectric actuator 10 (the piezoelectric member 120) is driven by the control as described in the first embodiment, a vibration may be produced by the following mechanism.

As illustrated in FIG. 9A, the moving member 12 is driven to move by driving displacement of the driving piezoelectric element portion 121, when the clutch piezoelectric element portion 122 is not contracted in a clutch displacement direction (the friction member 123 being in pressure contact with the moving member 12). Then, as illustrated in FIG. 9B, when driving of movement reaches an end (near a tail end of the stroke of driving movement), the clutch piezoelectric element portion 122 contracts as illustrated in FIG. 9C. The pressure contact of the friction member 123 with the moving member 12 is released by this contraction. Under this state the driving piezoelectric element portion 121 moves in a −X direction.

Here, when the clutch piezoelectric element portion 122 is contracting, it is ideal if, as illustrated in FIG. 9C, the piezoelectric member 120 (the friction member 123) maintains a state of being parallel with the moving member 12 and separates from the moving member 12 (a driven surface 12A) in an attitude that is level front to rear and left to right.

However, at the time when the piezoelectric member 120 separates from the moving member 12, the piezoelectric member 120 is subject to a reaction force from the moving member 12 and, a tilt is produced at an upper face (an upper face of the piezoelectric member 120) as illustrated in FIG. 9D. As a result, the piezoelectric member 120 vibrates to the left and right of the drawing and, as illustrated in FIG. 9E, a corner portion of the upper face of the piezoelectric member 120 collides with a lower face of the moving member 12 (the driven surface 12A). This induces abnormal vibrations in the moving member 12, which leads to effects such as unusual noises, a decrease in driving force and the like.

In the piezoelectric member 120 of the second embodiment, tilting in the X direction is detected from the detection outputs of the first detection electrode 124B$a$ and the second detection electrode 124B$b$. A driving signal is inputted to the first input electrode 122C$a$ or the second input electrode 122C$b$ of the clutch piezoelectric element portion 122 in response to the detection signals. Accordingly, it is possible to correct tilting of the piezoelectric member 120 and suppress swaying vibrations of the piezoelectric actuator 10.

For example, if the piezoelectric member 120 deforms to an attitude illustrated in FIG. 9D, a positive voltage signal is outputted from the first detection electrode 124B$a$ at the left side (the −X direction side) of FIG. 8, and a negative voltage signal is outputted from the second detection electrode 124B$b$ at the right side (the +X direction side) of FIG. 8. In this manner, it is apparent that a deformation is occurring in which the left side in FIG. 8 (the −X direction side) of the piezoelectric member 120 is extending (deforming to the +Y direction side), and the right side in FIG. 8 (the +X direction side) of the piezoelectric member 120 is contracting (deforming to the −Y direction side).

Accordingly, on the basis of this detection result, a control signal is applied to the first input electrode 122Ca or the second input electrode 122Cb of the clutch piezoelectric element portion 122 to displace the piezoelectric element 122A in a direction opposite to the deformation of the piezoelectric member 120. That is, a negative control signal is applied to the first input electrode 122Ca of the clutch piezoelectric element portion 122 and a positive control signal is applied to the second input electrode 122Cb. In this manner, it is possible to counteract and suppress the swaying vibration of the piezoelectric member 120.

The set of three piezoelectric members 120A, 120B and 120C configured as described above are controlled for driving by the driving control device 130 as illustrated in FIG. 10. The constituent of the driving control device 130 is the same as in the first embodiment described above and is not described here. The second embodiment includes vibration detectors 35 (35A, 35B and 35C) and attenuation signal generators 36 (36A, 36B and 36C) for controlling vibrations of the piezoelectric members 120A, 120E and 120C in addition to the constituents of the first embodiment.

The vibration detector 35 detects a vibration from detection outputs from the detection electrode 124B (the first detection electrode 124Ba and the second detection electrode 124Bb) of the detection piezoelectric element portion 124 of the respective piezoelectric member 120, and inputs vibration information to the attenuation signal generator 36.

On the basis of the vibration information inputted from the vibration detector 35, the attenuation signal generator 36 generates driving signals to cancel out a vibration, and inputs the driving signals to the input electrode 122C (the first input electrode 122Ca and the second input electrode 122Cb) of the clutch piezoelectric element portion 122.

Figure 11:
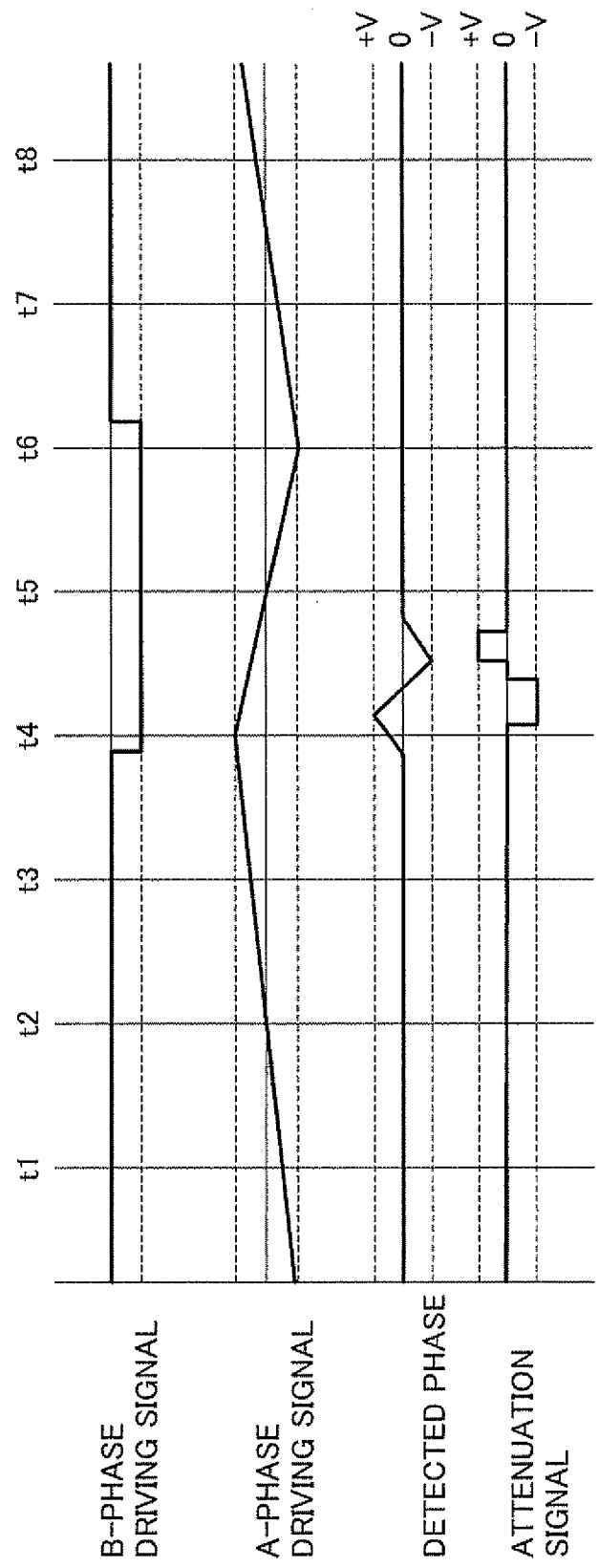
FIG. 11 is a time chart of driving signals describing a vibration suppression operation of the piezoelectric member of the second embodiment.

Next, a vibration suppression operation of the piezoelectric member 120 of the second embodiment is described with reference to FIG. 11 and FIGS. 12A to 12D. FIG. 11 is a time chart of driving signals describing a vibration suppression operation of the piezoelectric member 120. "Detected phase" in FIG. 11 represents the detection outputs from the detection electrode 124B (the first detection electrode 124Ba and the second detection electrode 124Bb) of the detection piezoelectric element portion 124. "Attenuation signal" is a signal for suppressing vibrations inputted to the first input electrode 122Ca or the second input electrode 122Cb of the clutch piezoelectric element portion 122. FIGS. 12A to 12D are diagrams schematically illustrating states of the piezoelectric member 120 at particular times (tx) in FIG. 11.

Usual driving control is the same as in the first embodiment described above, so is not described. Only vibration control for a typical piezoelectric member 120 is described. Such vibration control is performed separately for the three piezoelectric members 120A, 120B and 120C.

Time t1:
An A-phase driving signal is changing in a positive direction, and a B-phase driving signal is at 0 V.

Figure 12:
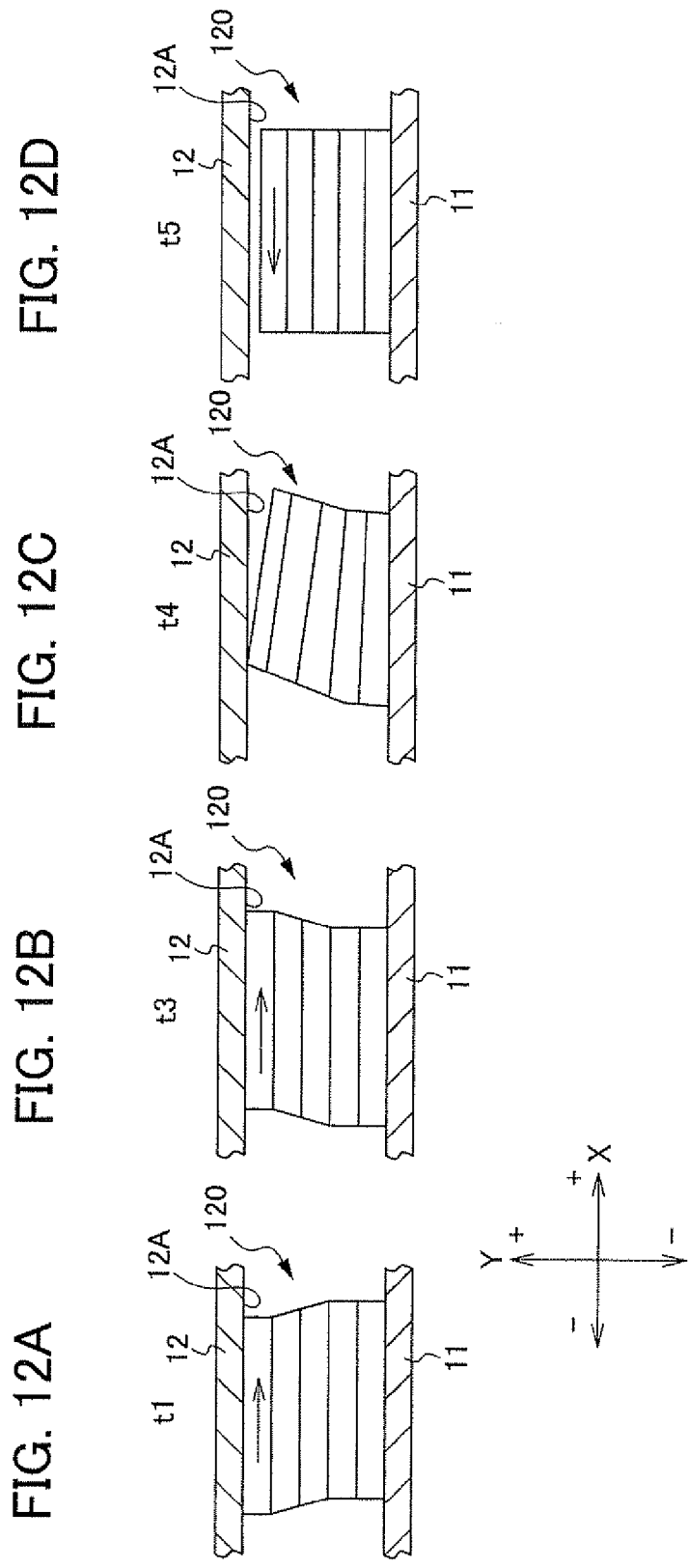
FIGS. 12A to 12D are diagrams schematically illustrating states of the piezoelectric member at particular times in the time chart shown in FIG. 11.

As illustrated in FIG. 12A, the piezoelectric member 120 is not contracted in a clutch displacement direction and is in pressure contact with the moving member 12, and is at a start of a stroke of driving movement that displaces the moving member 12 in the +X direction.

Time t3:
The A-phase driving signal is changing in the positive direction, and the B-phase driving signal is at 0 V.

As illustrated in FIG. 12B, the piezoelectric member 120 is not contracted in the clutch displacement direction and is in pressure contact with the moving member 12, and is close to an end of the stroke of driving movement that displaces the moving member 12 in the +X direction.

Time t4:
The A-phase driving signal is at a positive side peak, and the B-phase driving signal has just gone to −V2.

As illustrated in FIG. 12C, the piezoelectric member 120 has separated from the moving member 12, but a reaction force resulting from a driving force acting on the moving member 12 is produced. Accordingly, the piezoelectric member 120 experiences a force in a direction opposite to the driving direction, and a swaying vibration of the piezoelectric actuator 10 is produced. The detected phase detects this vibration state, and an attenuation signal is applied to the clutch piezoelectric element portion 122 to restrain the detected vibration.

Time t5:
The A-phase driving signal is changing in a negative direction, and the B-phase driving signal is at −V2.

As illustrated in FIG. 12D, the swaying vibration of the piezoelectric actuator 10 is suppressed, and the piezoelectric member 120 is separated from the moving member 12 in a state free of vibration.

According to the second embodiment, it is possible to reduce swaying vibrations of the piezoelectric actuator, which particularly occur during high-load driving, thereby increasing transmitted driving force and drive efficiency and enabling driving at high rotation speeds.

Third Embodiment

Next, a third embodiment of the present invention is described with reference to FIG. 13 and FIG. 14. Similarly to the piezoelectric actuator 1 of the first embodiment, a piezoelectric actuator 200 of the third embodiment is provided with a plurality of piezoelectric members 220. The constituent of each piezoelectric member 220 is the same as in the first embodiment, and is provided with a driving piezoelectric element portion 221 and clutch piezoelectric element portion 222. Differences between the first embodiment and the third embodiment are that the piezoelectric members 220 of the third embodiment are disposed in an annular arrangement and are disposed inside a lens barrel.

Figure 13:
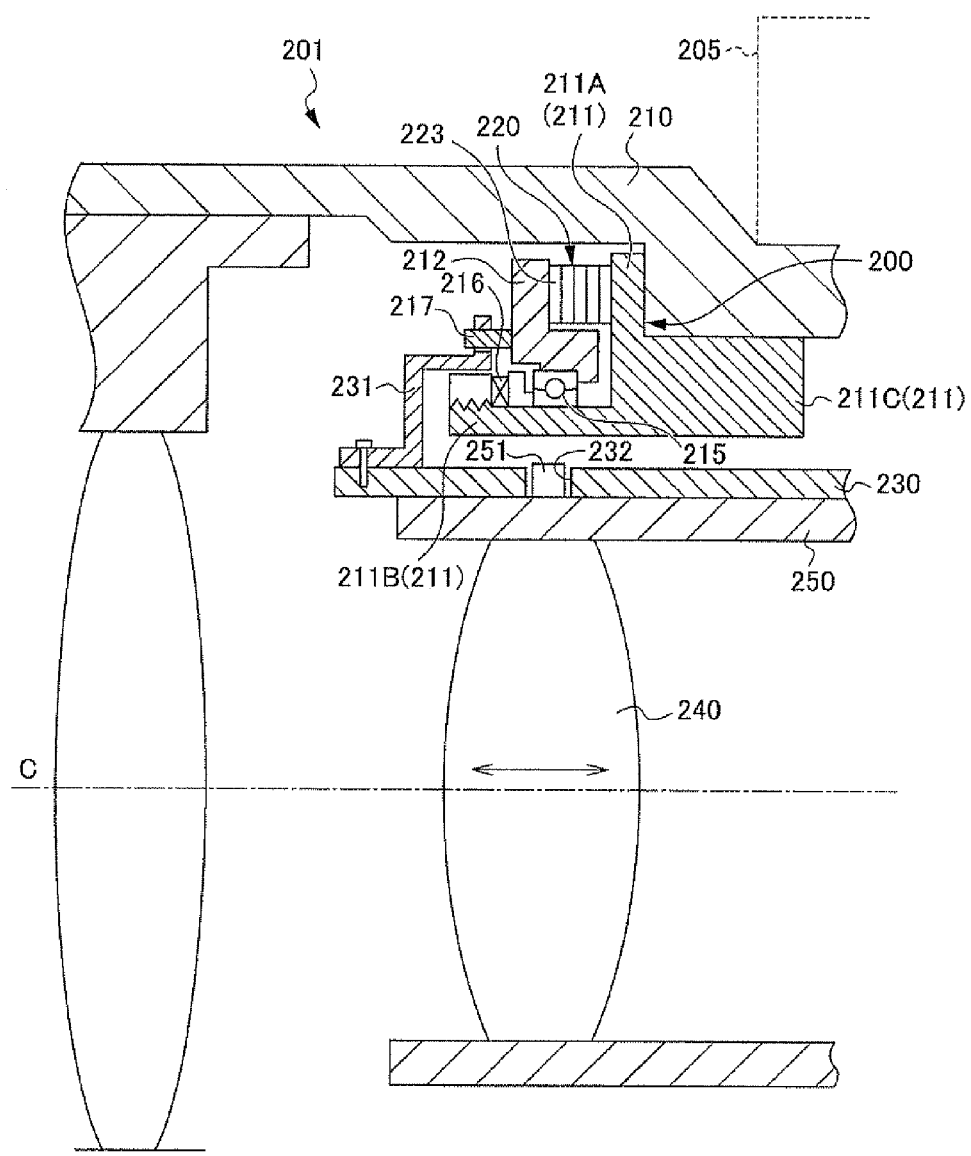
FIG. 13 is a schematic cross-sectional diagram of a lens barrel of a third embodiment.
Figure 14:
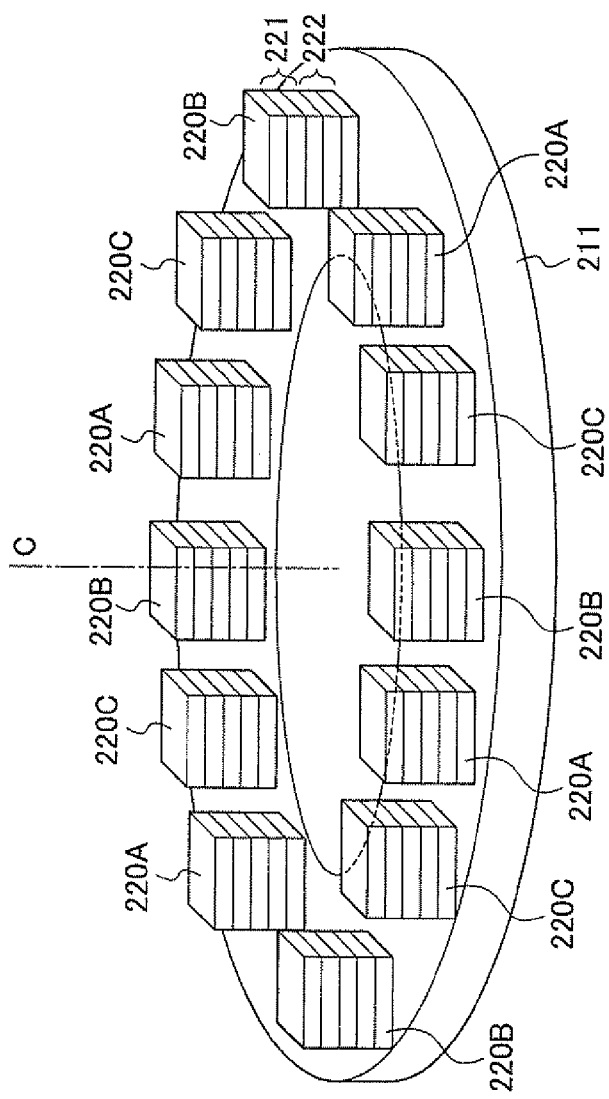
FIG. 14 is a schematic diagram of a piezoelectric actuator of the third embodiment.

FIG. 13 is a schematic cross-sectional diagram of a lens barrel 201 that is equipped with the piezoelectric actuator 200. The lens barrel 201 is an interchangeable lens that is mountable to and detachable from a camera body 205. FIG. 14 is a schematic diagram of the piezoelectric actuator 200, shown with the object side of the direction of an optical axis C of the lens barrel 201 at the top. In FIG. 14, for simple description of the structure, a moving member 212 of the piezoelectric actuator 200 is not illustrated and a base member 211 is shown with an annular shape.

As illustrated in FIG. 13, the lens barrel 201 is equipped with a fixed tube 210 that is disposed at the outermost periphery side of the lens barrel 201 and that is fixed to the camera body 205 when the lens barrel 201 is mounted to the camera body 205. The piezoelectric actuator 200 is mounted at an inner periphery side of the fixed tube 210. A cam tube 230 having a cam groove 232 is disposed at a further inner periphery side of the piezoelectric actuator 200. An autofocus tube 250 retaining an autofocus lens 240 is disposed at a still further inner periphery side of the cam tube 230.

The piezoelectric actuator 200 has an annular shape (a tubular shape) centered about the optical axis C. The base member 211 of the piezoelectric actuator 200 is fixed to the fixed tube 210 of the lens barrel 201.

The base member 211 of the piezoelectric actuator 200 includes a protrusion portion 211A, at which a substantially central portion of the tubular shape protrudes to the outer radial side, a distal end portion 211B, which is distal (at the object side) relative to the protruding portion of the tube, and a rear end portion 211C at the rear (imaging side), which is thicker than the distal end portion 211B.

The piezoelectric actuator 200 is provided with a set of three piezoelectric members 220A, 220B and 220C. These piezoelectric members 220A, 220B and 220C are disposed on a face of an object side of the protrusion portion 211A of the base member 211. The piezoelectric members 220A, 220B and 220C are lined up such that this sequence is repeated four times. That is, a total of 12 piezoelectric members are disposed on the base member 211, arrayed in the order piezoelectric member 220A, 220B, 220C, 220A, 220B, 220C . . . A driving control apparatus that drives the piezoelectric members 220 is similar to the driving control device 30 of the first embodiment.

Returning to FIG. 13, the moving member 212 is in pressure contact with a friction member 223 of the piezoelectric member 220, and is turned by driving force of the piezoelectric member 220. A bearing 215 is mounted between the inner radial side of the moving member 212 and the distal end portion 211B of the base member 211. A wave washer 216 is mounted at the distal end portion 211B of the base member 211, and the piezoelectric actuator 200 is subjected to a pressure force generated by the wave washer 216 via the bearing 215. A pin 217 that extends toward the object in the optical axis direction is provided at the object side of the moving member 212.

A fork member 231 is fixed to the cam tube 230 of the lens barrel 201 on the object side in the optical axis direction. The above-mentioned pin 217 provided at the moving member 212 is engaged with this fork member 231.

A movement pin 251 is provided at an outer periphery of the autofocus tube 250 that retains the autofocus lens 240. The movement pin 251 is engaged with the cam groove 232 formed in the cam tube 230.

In the lens barrel 201 of the present embodiment, when driving signals are inputted from the camera body 205 to the piezoelectric actuator 200, the piezoelectric members 220A, 220E and 220C respectively in sequence repeat the operation of making contact with the moving member 212, causing the moving member 212 to move in a desired turning direction and to separate from the moving member 212, in a similar manner to the first embodiment. In this manner, the moving member 212 is driven to turn about the optical axis C.

When the moving member 212 turns, the pin 217 also turns and, via the fork member 231, the cam tube 230 turns. When the cam tube 230 turns, the autofocus tube 250 linearly moves, the autofocus lens 240 is driven in the optical axis direction, and an autofocus operation is carried out. The cam tube 230 is equipped with an unillustrated encoder. When it is confirmed based on detection values sent from the encoder that the autofocus lens 240 has reached a desired position, the piezoelectric actuator 200 is stopped.

According to the present embodiment, in addition to the effects of the first embodiment, it is possible to improve transmitted driving force and drive efficiency of a lens inside a lens barrel and enable driving at high rotation speeds.

VARIANT EXAMPLES

The present invention is not limited to the embodiments described above. Numerous modifications and improvements as illustrated below are possible and are encompassed by the technical scope of the present invention.

(1) In the present embodiments, the driving piezoelectric element portion 21 and 121 and the clutch piezoelectric element portion 22 and 122 are respectively constituted by two layers of piezoelectric elements (the piezoelectric elements 21A and 21B and the piezoelectric elements 22A and 22B). However, this is in order to simplify descriptions; the piezoelectric elements may alternatively be laminated in multiple layers, such as four layers or more. When the number of layers is larger, a voltage corresponding to a required amount of movement may be lowered.

(2) In the present embodiments, a set of three piezoelectric members 20, 120 or 220, respectively, has been described as an example. Obviously, however, a configuration may alternatively be possible in which a set of three is a single group and a large number of groups is provided. Moreover, a configuration may alternatively be possible in which a group (that repeats a stroke cycle) is configured by a set of three or more of the piezoelectric members 20 or 120. Accordingly, it may be possible to implement more consistent and smooth driving.

(3) In the third embodiment, an annular actuator provided with the piezoelectric actuators of the first embodiment has been described, but this is not limiting. An annular actuator that is provided with the piezoelectric actuators of the second embodiment may alternatively be provided.

The embodiments and variant examples may be used in suitable combinations, though detailed descriptions are not given here. The present invention is in no way limited by the embodiments described above.

The invention claimed is:

1. A piezoelectric actuator comprising:
   a plurality of piezoelectric members each including a first piezoelectric element deformable in a first direction and a second piezoelectric element deformable in a second direction intersecting the first direction, the plurality of piezoelectric members being divided into a plurality of groups;
   a relative movement member that includes a contact surface in contact with the piezoelectric members and relatively moves in the first direction with respect to the piezoelectric members; and
   a driving unit configured to drive a first piezoelectric element of a piezoelectric member of a group such that the relative movement member relatively moves in the first direction, when the piezoelectric member of the group among the plurality of groups is in contact with the contact surface, and to drive a second piezoelectric element of another piezoelectric member of another group of the plurality of groups such that another piezoelectric member of another group separates from the contact surface while driving the first piezoelectric element of the piezoelectric member of the group.

2. The piezoelectric actuator according to claim 1, wherein the driving unit generates a first driving signal that controls a displacement of the first piezoelectric element in the first direction, and a second driving signal that controls a displacement of the second piezoelectric element in the second direction and includes a waveform different from the first driving signal.

3. The piezoelectric actuator according to claim 2, wherein the first driving signal is a triangular waveform signal and the second driving signal is a rectangular waveform signal.

4. The piezoelectric actuator according to claim 1, wherein the plurality of groups comprises at least three groups.

5. The piezoelectric actuator according to claim 1, further comprising:
a base member that retains the piezoelectric members; and
a third piezoelectric element provided between the base member and each piezoelectric member, the third piezoelectric element being deformable in the second direction and including a first portion and a second portion arranged along the first direction.

6. The piezoelectric actuator according to claim 5, wherein the driving unit causes the first piezoelectric element to be displaced in the first direction such that the relative movement member moves in the first direction, and subsequently applies driving signals to the first portion and the second portion of the third piezoelectric element in waveforms differing from each other so as to counteract a vibration of the piezoelectric member that is caused by an impact force acting on the piezoelectric member, when the driving unit causes the second piezoelectric element to be displaced in the second direction such that the relative movement member separates from the piezoelectric member.

7. The piezoelectric actuator according to claim 5, further comprising a detector that detects a voltage produced between the first portion and the second portion and is provided between the base member and the third piezoelectric element, wherein the driving unit causes the first piezoelectric element to be displaced in the first direction such that the relative movement member moves in the first direction, and subsequently applies respective voltage signals to the first portion and the second portion of the third piezoelectric element so as to counteract a voltage detected by the detector, when the driving unit causes the second piezoelectric element to be displaced in the second direction such that the relative movement member separates from the piezoelectric member.

8. The piezoelectric actuator according to claim 1, wherein the first piezoelectric element is disposed more adjacent to the relative movement member than the second piezoelectric element.

9. A lens barrel comprising the piezoelectric actuator according to claim 1.

10. A camera comprising the piezoelectric actuator according to claim 1.

11. A piezoelectric actuator comprising:
a base member including an annular portion;
a plurality of piezoelectric members each including a first piezoelectric element deformable in a first direction and a second piezoelectric element deformable in a second direction intersecting the first direction, the first direction being arranged tangential to a circumference of the annular portion of the base member, and the plurality of piezoelectric members being divided into a plurality of groups;
a relative movement member that includes a contact surface in contact with the piezoelectric members and relatively moves in the first direction with respect to the piezoelectric members; and
a driving unit configured to drive a first piezoelectric element of a piezoelectric member of a predetermined group such that the relative movement member relatively moves in the first direction, when the piezoelectric member of the predetermined group among the plurality of groups is in contact with the contact surface, and to drive a second piezoelectric element of another piezoelectric member of another group differing from the predetermined group such that another piezoelectric member of another group differing from the predetermined group separates from the contact surface while driving the first piezoelectric element of the piezoelectric member of the predetermined group.

* * * * *